United States Patent
Chang et al.

(10) Patent No.: US 10,177,005 B2
(45) Date of Patent: Jan. 8, 2019

(54) CRITICAL DIMENSION CONTROL FOR DOUBLE PATTERNING PROCESS

(71) Applicant: Taiwan Semiconductor Manufacturing Company, Ltd., Hsinchu (TW)

(72) Inventors: Che-Cheng Chang, New Taipei (TW); Chih-Han Lin, Hsinchu (TW); Horng-Huei Tseng, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 15/943,466

(22) Filed: Apr. 2, 2018

(65) Prior Publication Data

US 2018/0226265 A1 Aug. 9, 2018

Related U.S. Application Data

(62) Division of application No. 14/954,380, filed on Nov. 30, 2015, now Pat. No. 9,934,985.

(51) Int. Cl.
*H01L 29/66* (2006.01)
*H01L 27/092* (2006.01)
(Continued)

(52) U.S. Cl.
CPC .... *H01L 21/31144* (2013.01); *H01L 21/0337* (2013.01); *H01L 21/32134* (2013.01); *H01L 21/32135* (2013.01); *H01L 21/32139* (2013.01); *H01L 21/823437* (2013.01); *H01L 21/823828* (2013.01); *H01L 27/092* (2013.01); (Continued)

(58) Field of Classification Search
CPC ....... H01L 21/31144; H01L 21/823437; H01L 21/823456; H01L 21/823828; H01L 21/82385; H01L 27/092; H01L 27/0924; H01L 29/66545
See application file for complete search history.

(56) References Cited

U.S. PATENT DOCUMENTS

2007/0004117 A1 1/2007 Yagishita
2012/0025323 A1* 2/2012 Teo .................. H01L 21/823425
257/384
(Continued)

FOREIGN PATENT DOCUMENTS

TW 201448054 A 12/2014

*Primary Examiner* — Joseph M Galvin, III
(74) *Attorney, Agent, or Firm* — Slater Matsil, LLP

(57) ABSTRACT

In a method for manufacturing a semiconductor device, a dummy gate layer and a hard mask layer are sequentially formed on a substrate. A first doped portion is formed in the dummy gate layer, and has an etching selectivity with respect to the other portion of the dummy gate layer. Etching masks are formed on portions of the hard mask layer. The hard mask layer and the dummy gate layer are etched to pattern the first doped portion and the other portion of the dummy gate layer into first dummy gates and second dummy gates. The first dummy gates and the second dummy gates have different widths. A dielectric layer is formed to peripherally enclose each of the first dummy gates and each of the second dummy gates. The first dummy gates and the second dummy gates are replaced with first metal gates and second metal gates.

20 Claims, 13 Drawing Sheets

(51) Int. Cl.
   *H01L 21/311*    (2006.01)
   *H01L 21/8234*   (2006.01)
   *H01L 21/8238*   (2006.01)
   *H01L 21/033*    (2006.01)
   *H01L 21/3213*   (2006.01)
   *H01L 21/3215*   (2006.01)

(52) U.S. Cl.
   CPC .. *H01L 29/66545* (2013.01); *H01L 21/32155* (2013.01); *H01L 21/82385* (2013.01); *H01L 21/823456* (2013.01); *H01L 27/0924* (2013.01)

(56) References Cited

U.S. PATENT DOCUMENTS

2013/0062704 A1*  3/2013  Cheng ............. H01L 21/823857
                                                         257/369
2014/0370699 A1* 12/2014  Kim ................. H01L 21/28008
                                                         438/587
2015/0147867 A1   5/2015  Shieh et al.

* cited by examiner

CRITICAL DIMENSION CONTROL FOR DOUBLE PATTERNING PROCESS

PRIORITY CLAIM

This application is a divisional of and claims priority to U.S. patent application Ser. No. 14/954,380, filed on Nov. 30, 2015, and entitled "Critical Dimension Control for Double Patterning Process", which application is incorporated herein by reference.

BACKGROUND

The semiconductor integrated circuit (IC) industry has experienced rapid growth. In the course of the IC evolution, functional density (defined as the number of interconnected devices per chip area) has generally increased while geometry size (i.e., the smallest component (or line) that can be created using a fabrication process) has decreased. A scaling down process generally provides benefits by increasing production efficiency and lowering associated costs. But, such scaling down has increased the complexity of processing and manufacturing ICs. For these advances to be realized, similar developments in IC manufacturing are needed.

For example, as the semiconductor IC industry has progressed into nanometer technology process nodes in pursuit of higher device density, higher performance, and lower costs, challenges from both fabrication and design have resulted in the development of three-dimensional (3D) devices such a fin-like field effect transistors (FinFETs). However, conventional FinFET devices and methods of fabricating the FinFET devices have not been entirely satisfactory in every aspect.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
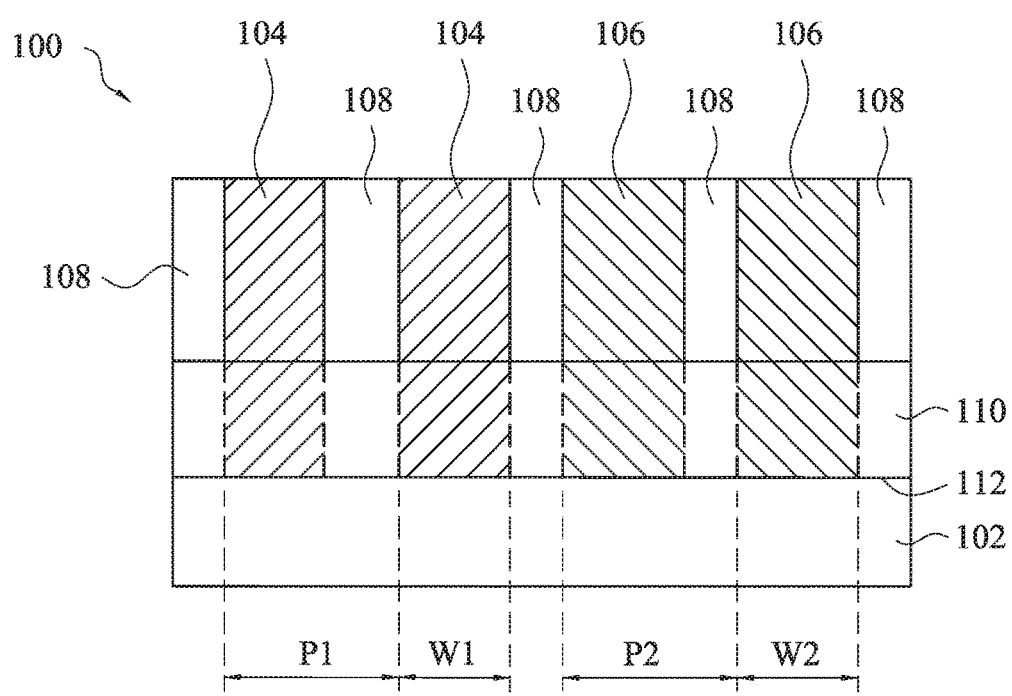
FIG. 1 is schematic front view of a semiconductor device in accordance with various embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

Terms used herein are only used to describe the specific embodiments, which are not used to limit the claims appended herewith. For example, unless limited otherwise, the term "one" or "the" of the single form may also represent the plural form. The terms such as "first" and "second" are used for describing various devices, areas and layers, etc., though such terms are only used for distinguishing one device, one area or one layer from another device, another area or another layer. Therefore, the first area can also be referred to as the second area without departing from the spirit of the claimed subject matter, and the others are deduced by analogy. In addition, the present disclosure may repeat reference numerals and/or letters in the various examples. This repetition is for the purpose of simplicity and clarity and does not in itself dictate a relationship between the various embodiments and/or configurations discussed. As used herein, the term "and/or" includes any and all combinations of one or more of the associated listed items.

In the manufacturing of a semiconductor device, a double patterning process, such as a self-aligned double patterning (SADP) process and a lithography-etch lithography-etch (LELE) process, can be used to form various gates with the same critical dimension (CD). Due to electrical requirements, a critical dimension of a p-type metal gate may need to be greater than that of an n-type metal gate. However, the typical double patterning process cannot form metal gates with different critical dimensions.

Embodiments of the present disclosure are directed to providing a semiconductor device and a method for manufacturing the semiconductor device, in which after a dummy gate layer is formed or a hard mask layer is formed on the dummy gate layer, at least one doped portion is formed in the dummy gate layer. The doped portion has an etching selectivity with respect to the other portion of the dummy gate layer during an operation of etching a dummy gate layer. After the hard mask layer and the dummy gate layer are etched with various etching masks disposed on the hard mask layer to form first dummy gates and second dummy gates, a width of each first dummy gate formed from the doped portion is different from a width of each second dummy gate formed from the other portion of the dummy gate layer. Thus, after a subsequent gate replacement operation, first metal gates replacing the first dummy gates have different critical dimensions from second metal gates replacing the second dummy gates. Therefore, the double patterning technique according to the embodiments of the present disclosure can fabricate metal gates with different critical dimensions.

FIG. 1 is schematic front view of a semiconductor device in accordance with various embodiments. In some embodiments, a semiconductor device 100 may include a substrate 102, first metal gates 104, second metal gates 106 and a dielectric layer 108. The first metal gates 104, the second metal gates 106 and the dielectric layer 108 are disposed over the substrate 102.

In some examples, the semiconductor device 100 is a FinFET device, and the semiconductor device 100 further includes at least one fin structure 110. In such examples, the fin structure 110 is disposed on the substrate 102. In some exemplary examples, the fin structure 110 is formed by recessing the substrate 102, and thus the fin structure 110 protrudes from a recessed surface 112 of the substrate 102, and the fin structure 110 and the substrate 102 are formed from the same material. The substrate 102 and the fin structure 110 may be composed of a single-crystalline semiconductor material or a compound semiconductor material. For example, silicon, germanium or glass may be used as a material of the substrate 102 and the fin structure 110. In some exemplary examples, the substrate 102 and the fin structure 110 are composed of silicon.

Referring to FIG. 1 again, the first metal gates 104 are respectively disposed on portions of the surface 112 of the substrate 102, and the first metal gates 104 are separated. In addition, each of the first metal gates 104 is disposed on a portion of the fin structure 110. Each of the first metal gates 104 has a width W1, and the first metal gates 104 have a pitch P1, in which the pitch P1 of the first metal gates 104 is measured from one side of one first metal gate 104 to the same side of the adjacent first metal gate 104. For example, the pitch P1 of the first metal gates 104 is a distance between a left side of one first metal gate 104 and a left side of the adjacent first metal gate 104. In certain examples, for each of first metal gates 104, the pitch P1 is substantially the same, and the width W1 is substantially the same. For example, the width W1 of each of the first metal gates 104 may range from about 3 nm to about 300 nm.

As shown in FIG. 1, the second metal gates 106 are respectively disposed on other portions of the surface 112 of the substrate 102, and the second metal gates 106 are separated. The second metal gates 106 are separated from the first metal gates 104. In some examples, the second metal gates 106 are adjacent to the first metal gates 104. In addition, each of the second metal gates 106 is disposed on a portion of the fin structure 110. The first metal gates 104 and the second metal gates 106 may be formed from the same metal material, or may be formed from different metal materials. Each of the second metal gates 106 has a width W2, and the second metal gates 106 have a pitch P2, in which the pitch P2 of the second metal gates 106 is measured from one side of one second metal gate 106 to the same side of the adjacent second metal gate 106. For example, the pitch P2 of the second metal gates 106 is a distance between a left side of one second metal gate 106 and a left side of the adjacent second metal gate 106. In certain examples, for each of second metal gates 106, the pitch P2 is substantially the same, and the width W2 is substantially the same. For example, the width W2 of each of the second metal gates 106 may range from about 3 nm to about 300 nm.

The width W1 of each of the first metal gates 104 is different from the width W2 of each of the second metal gates 106. In some examples, the pitch P1 of the first metal gates 104 is substantially the same as the pitch P2 of the second metal gates 106. Certainly, the pitch P1 may be different from the pitch P2. In some exemplary examples, the first metal gates 104 are n-type metal gates, the second metal gates 106 are p-type metal gates, and the width W2 of each of the second metal gates 106 is greater than the width W1 of each of the first metal gates 104. In such examples, the width W2 of each of the second metal gates 106 of p-type is greater than the width W1 of each of the first metal gates 104 of n-type, such that the electrical requirements of the semiconductor device 100 are met, thereby increasing performance of the semiconductor device 100.

The dielectric layer 108 is disposed over the surface 112 of the substrate 102. Referring to FIG. 1, the dielectric layer 108 fills a gap between the first metal gates 104, a gap between the second metal gates 106, and a gap between the first metal gate 104 and the adjacent second metal gate 106, thereby peripherally enclosing each of the first metal gates 104 and each of the second metal gates 106. In some exemplary examples, the dielectric layer 106 is formed from silicon oxide, silicon nitride or silicon oxynitride.

Figure 2A:
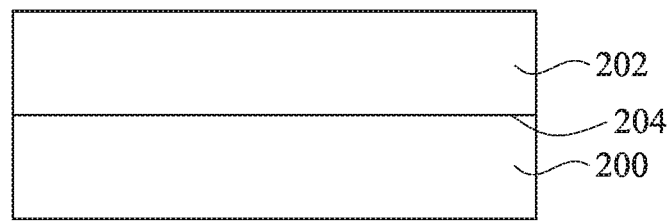
FIG. 2A through FIG. 2J are schematic front views of intermediate stages showing a method for manufacturing a semiconductor device in accordance with various embodiments.

FIG. 2A through FIG. 2J are schematic front views of intermediate stages showing a method for manufacturing a semiconductor device in accordance with various embodiments. As shown in FIG. 2A, a substrate 200 is provided. In some examples, the substrate 200 may be optionally recessed to form at least one fin structure 202 on a surface 204 of the substrate 200 by using, for example, a photolithography process and an etching process.

In the operation of recessing the substrate 200, a portion of the substrate 200 is removed. In such examples, the fin structure 202 is composed of a portion of the substrate 200, such that the fin structure 202 is formed from a material the same as that of the substrate 200. The substrate 200 and the fin structure 202 may be composed of a single-crystalline semiconductor material or a compound semiconductor material. In some examples, silicon, germanium or glass may be used as a material of the substrate 200 and the fin structure 202. In some exemplary examples, the substrate 200 and the fin structure 202 are formed from silicon.

Figure 2B:
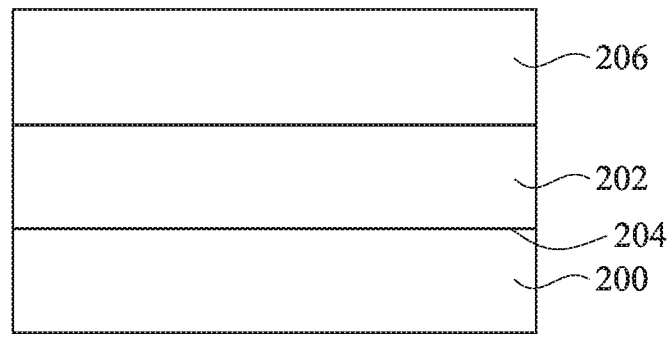

As shown in FIG. 2B, a dummy gate layer 206 is formed on the surface 204 of the substrate 200, in which the dummy gate layer 206 is disposed on a portion of the fin structure 202. In some examples, the dummy gate layer 206 is formed by using a deposition process and an etching process. The deposition process may be a chemical vapor deposition (CVD) process or a plasma-enhanced chemical vapor deposition (PECVD) process, for example. In some exemplary examples, the dummy gate layer 206 is formed from polysilicon.

Figure 2C:
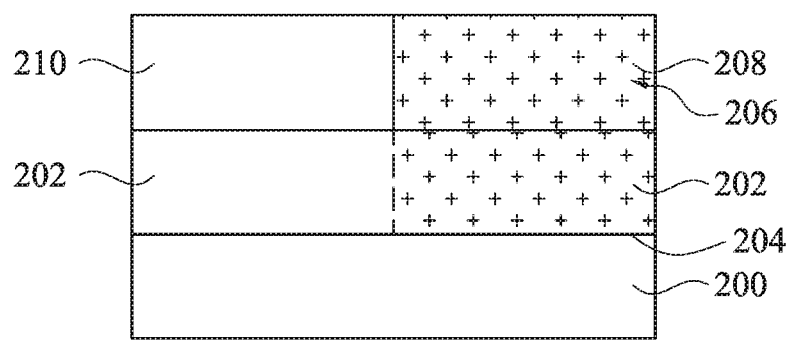

As shown in FIG. 2C, a first doped portion 208 is formed in the dummy gate layer 206. For example, the first doped portion 208 may extend from a top of the dummy gate layer 206 to a bottom of the dummy gate layer 206. In some examples, an operation of forming the first doped portion 208 includes performing an implant operation on the dummy gate layer 206. The implant operation is performed using at least one dopant, such as boron and phosphorous. Thus, the first doped portion 208 is formed from the material of the dummy gate layer 206 and is doped with the dopant, such that the first doped portion 208 may have an etching selectivity with respect to the dummy gate layer 206 during an operation of etching the dummy gate layer 206. After the implant operation is completed, the dummy gate layer 206 includes the first doped portion 208 and the other portion 210, in which the first doped portion 208 and the portion 210 are arranged in the dummy gate layer 206 side by side, and the portion 210 similarly extends from the top of the dummy gate layer 206 to the bottom of the dummy gate layer 206.

In some examples, the implant operation only forms the first doped portion 208 in the dummy gate layer 206, and the portion 210 of the dummy gate layer 206 is an undoped portion. Thus, the first doped portion 208 is formed to have an etching selectivity with respect to the portion 210 of the dummy gate layer 206 during the operation of etching the dummy gate layer 206.

In some examples, the implant operation includes forming the other portion 210 of the dummy gate layer 206 as a second doped portion. In such examples, the implant operation forms the first doped portion 208 and the portion 210 with different dopants. The portion 210 is formed from the material of the dummy gate layer 206 and is doped with the dopant different from that of the first doped portion 208. Thus, the first doped portion 208 is formed to have an etching selectivity with respect to the portion 210 of the dummy gate layer 206 during an operation of etching the dummy gate layer 206.

Figure 2D:
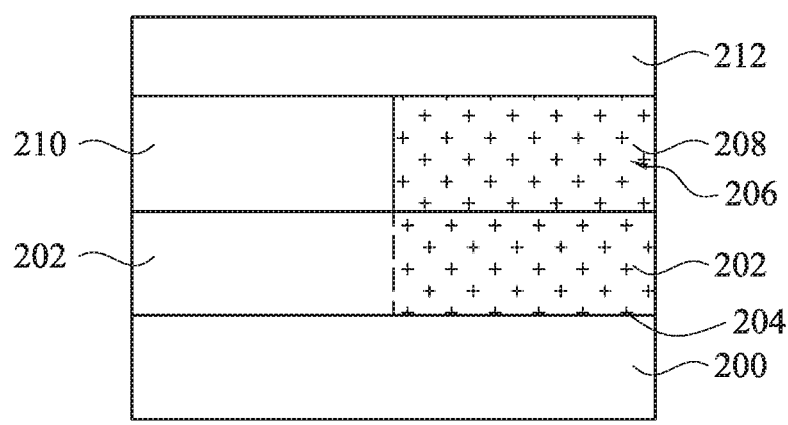

After the first doped portion 208 is formed, as shown in FIG. 2D, a hard mask layer 212 is formed on the dummy gate layer 206 to cover the first doped portion 208 and the portion 210 of the dummy gate layer 206. In some examples, an operation of forming the hard mask layer 212 is performed by using a deposition process, such as a chemical vapor deposition process and a physical vapor deposition (PVD) process. For example, the hard mask layer 212 may be formed from silicon nitride.

Figure 2E:
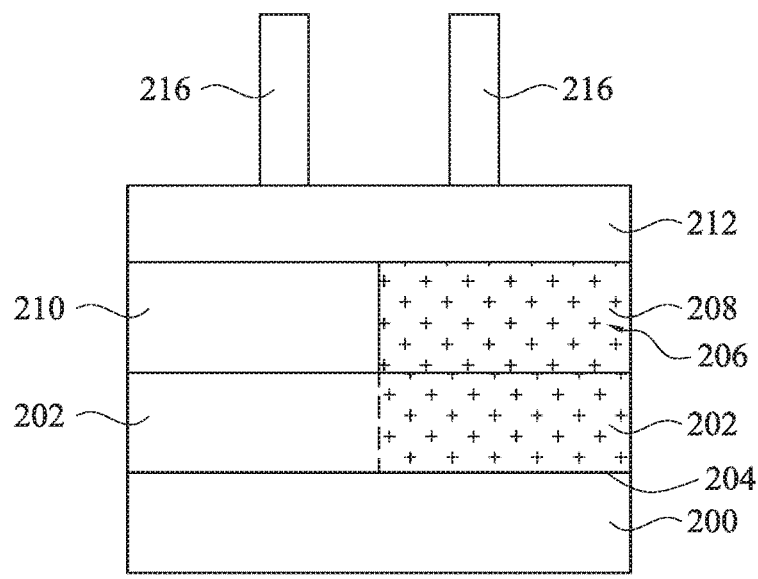
Figure 2F:
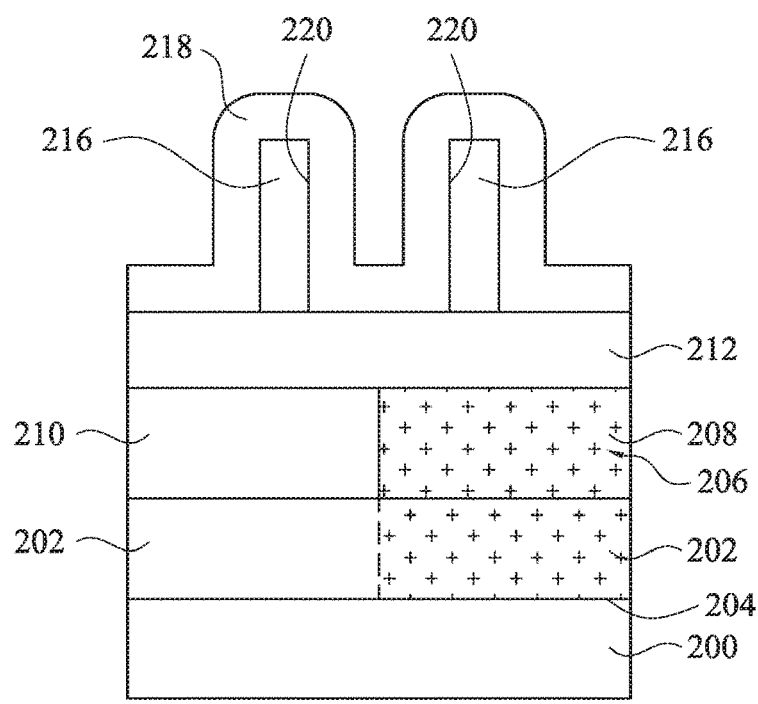
Figure 2G:
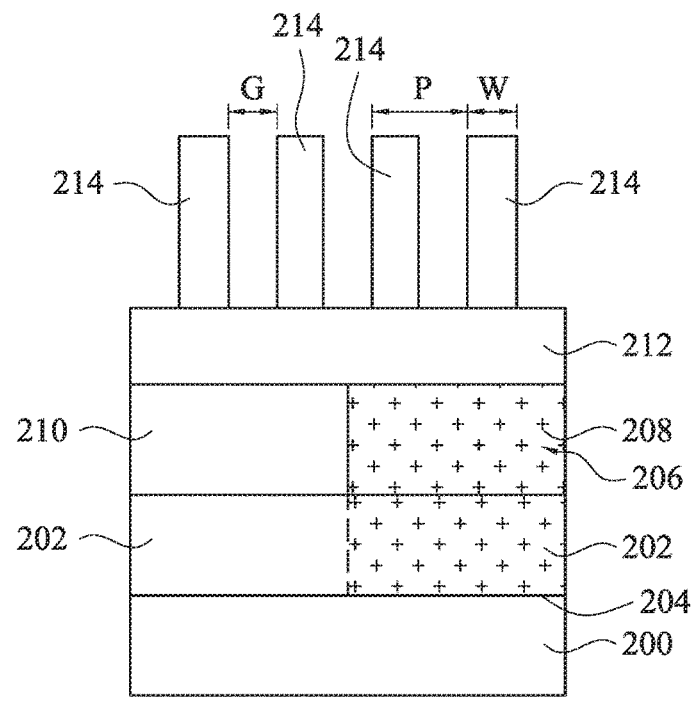

As shown in FIG. 2E through FIG. 2G, various etching masks 214 are respectively formed on portions of the hard mask layer 212. In some examples, an operation of forming the etching masks 214 is performed by using a double patterning process, such as a self-aligned double patterning process and a lithography-etch lithography-etch process. In some exemplary examples, as shown in FIG. 2E, various mandrels 216 are respectively formed on other portions of the hard mask layer 212 by using a deposition or coating process and a photolithography process. The mandrels 216 may substantially have the same width and the same pitch.

Next, as shown in FIG. 2F, a spacer material layer 218 is formed on the hard mask layer 212 and covering the mandrels 216. In some examples, the spacer material layer 218 is formed to conformally cover the hard mask layer 212 and the mandrels 216. For example, an operation of forming the spacer material layer 218 may be performed by using a deposition process, such as a chemical vapor deposition process and a physical vapor deposition process. A material of the spacer material layer 218 is different from those of the mandrels 216, the hard mask layer 212 and the dummy gate layer 206.

As shown in FIG. 2G, the mandrels 216 and a portion of the spacer material layer 218 are removed to form the etching masks 214 on the portions of the hard mask layer 212. The etching masks 214 are formed by removing the portion of the spacer material layer 218, such that the etching masks 214 are formed from a material the same as the spacer material layer 218. In some examples, an operation of forming the etching masks 214 includes removing the portion of the spacer material layer 218 to expose a portion of the hard mask layer 212 and tops of the mandrels 216, so as to form various spacers (the spacers are portions of the spacer material layer 218) for the etching masks 214. The spacers are respectively formed on two opposite side surfaces 220 of each of the mandrels 216 on the hard mask layer 212. Then, the mandrels 216 are removed and the spacers are left to form the etching masks 214, in which each of the etching masks 214 includes one of the spacers, as shown in FIG. 2G. For example, an operation of removing the portion of the spacer material layer 218 may be performed by using an etching back process. In addition, an operation of removing the mandrels 216 may be performed by using an etching process, such as a dry etching process and a wet etching process.

Referring to FIG. 2G again, in some examples, the operation of forming the etching masks 214 includes forming each of the etching masks 214 having a width W which is substantially equal to one another. In addition, the etching masks 214 are formed to substantially have the same pitch P. Thus, in such examples, gaps G between two adjacent ones of the etching masks 214 are substantially the same. Certainly, the widths W of the etching masks 214 may be different, and the pitches P of the two adjacent etching masks 214 may be different.

Figure 2H:
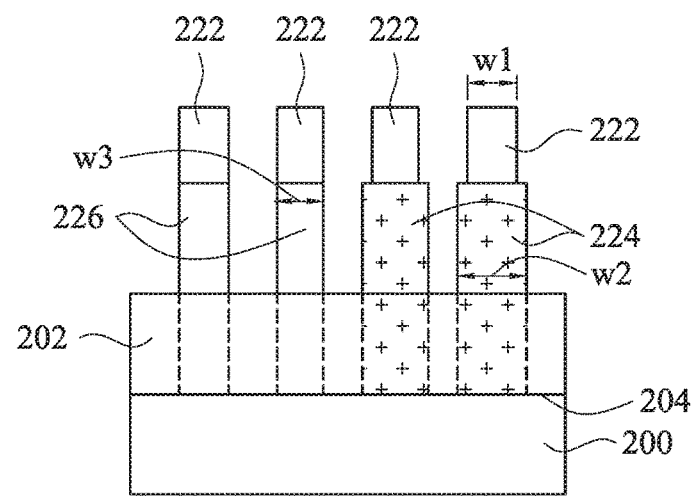

As shown in FIG. 2G, the hard mask layer 212 and the dummy gate layer 212 are etched by an etching process with the etching masks 214 on the hard mask layer 212. An operation of etching the hard mask layer 212 and the dummy gate layer 212 is performed to remove a portion of the hard mask layer 212 and a portion of the dummy gate layer 206, so as to respectively pattern the hard mask layer 212, the first doped portion 208 and the portion 210 of the dummy gate layer 206 into various hard masks 222, various first dummy gates 224 and various second dummy gates 226, as shown in FIG. 2H. For example, the second dummy gates 226 may be adjacent to the first dummy gates 224. In some exemplary examples, the hard mask layer 212 is firstly etched to form the hard masks 222, and the etching masks 214 are removed after the hard masks 222 are formed, and then the first doped portion 208 and the portion 210 of the dummy gate layer 206 are etched with the hard masks 222 on the dummy gate layer 206. For example, after the operation of etching the hard mask layer 212 is completed, widths of the hard masks 222 may be substantially the same.

Because the first doped portion 208 has an etching selectivity with respect to the portion 210 of the dummy gate layer 206, an etching amount of the first doped portion 208 is different from that of the portion 210 of the dummy gate layer 206 during the operation of etching the hard mask layer 212 and the dummy gate layer 212, and a width w2 of each of the first dummy gates 224 is different from a width w3 of each of the second dummy gates 226. In some examples, an etching rate of the first doped portion 208 is smaller than that of the portion 210 of the dummy gate layer 206, such that after the operation of etching the hard mask layer 212 and the dummy gate layer 212 is completed, the width w2 of each of the first dummy gates 224 is greater than the width w3 of each of the second dummy gates 226. For example, a width w1 of each of the hard masks 222 is substantially equal to the width w3 of each of the second dummy gates 226, and is smaller than the width w2 of each of the first dummy gates 224. Therefore, the first dummy gates 224 and the second dummy gates 226 with different widths are achieved.

Figure 2I:
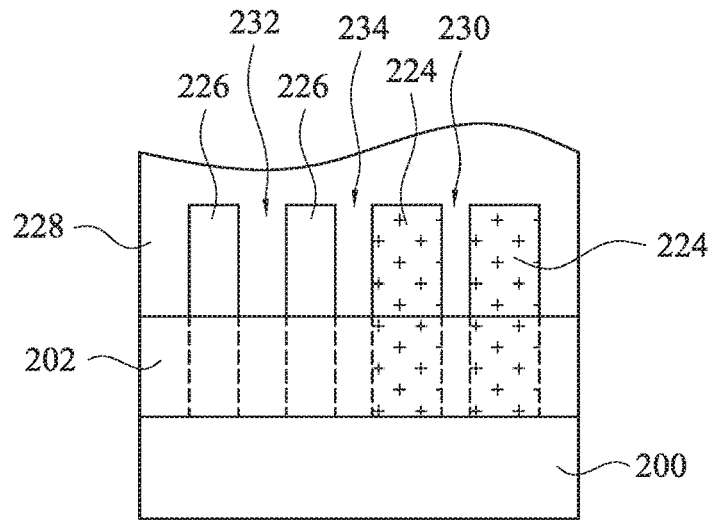

As shown in FIG. 2I, the hard masks 222 are removed, and a dielectric layer 228 is formed on the substrate 200, the first dummy gates 224 and the second dummy gates 226, and to fill a gap 230 between the first dummy gates 224, a gap 232 between the second dummy gates 226, and a gap 234 between the first dummy gate 224 and the second dummy gate 226 which are adjacent to each other, thereby peripherally enclosing each of the first dummy gates 224 and each of the second dummy gates 226. For example, an operation of forming the dielectric layer 228 may be performed by using a deposition process, such as a chemical vapor deposition process and a physical vapor deposition process. In some exemplary examples, the dielectric layer 228 is formed from silicon oxide, silicon nitride or silicon oxynitride.

Figure 2J:
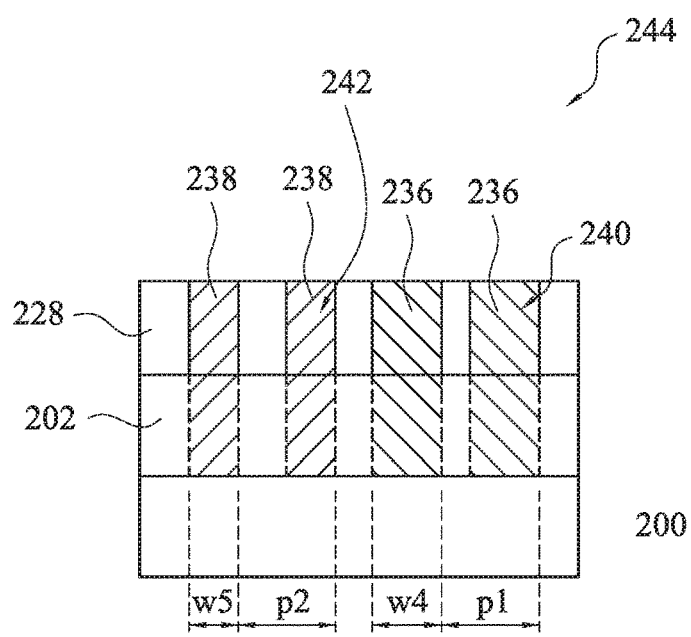

Then, as shown in FIG. 2I and FIG. 2J, the first dummy gates 224 and the second dummy gates 226 are replaced with first metal gates 236 and second metal gates 238 respectively to complete a semiconductor device 244. The first metal gates 236 and the second metal gates 238 may be formed from the same metal material, or may be formed from different metal materials. In some examples, an operation of replacing the first dummy gates 224 and the second dummy gates 226 includes performing a polishing process on the dielectric layer 228 to remove a portion of the dielectric layer 228 and expose tops of the first dummy gates 224 and the second dummy gates 226. Next, the first dummy gates 224 and the second dummy gates 226 are removed to correspondingly form first holes 240 and second holes 242 in the dielectric layer 228. A metal layer (the first metal gates 236 and the second metal gates 238 are portions of the metal layer) is formed to fill the first holes 240 and the second holes 242 and cover the dielectric layer 228. Then, the metal layer is polished to remove a portion of the metal layer over the dielectric layer 228, so as to form the first metal gates 236 and the second metal gates 238 in the first holes 240 and the second holes 242 respectively. Thus, the first metal gates 236 and the second metal gates 238 are peripherally enclosed by the dielectric layer 228.

In some exemplary examples, the polishing process of the dielectric layer 228 is performed by using a chemical mechanical polishing (CMP) technique. An operation of removing the first dummy gates 224 and the second dummy gates 226 may be performed using a dry etching technique or a wet etching technique. The width w2 of each of the first dummy gates 224 is greater than the width w3 of each of the second dummy gates 226, such that each of the first holes 240 is greater than each of the second holes 242. For example, an operation of forming the metal layer may be performed by using a deposition process, such as chemical vapor deposition process and a physical vapor deposition process. An operation of polishing the metal layer may be performed by using a chemical mechanical polishing process. In some exemplary examples, a portion of the dielectric layer 228 is polished during the operation of polishing the metal layer.

Referring FIG. 2J again, each of the first holes 240 is greater than each of the second holes 242, such that a width w4 of each of the first metal gates 236 is greater than a width w5 of each of the second metal gates 238. In some examples, a pitch p1 of the first metal gates 236 is substantially the same as a pitch p2 of the second metal gates 238. Certainly, the pitch p1 may be different from the pitch p2. In some exemplary examples, the first metal gates 236 are p-type metal gates, the second metal gates 238 are n-type metal gates, and the width w4 of each of the first metal gates 236 is greater than the width w5 of each of the second metal gates 238. In such examples, the width w4 of each of the first metal gates 236 of p-type is greater than the width w5 of each of the second metal gates 238 of n-type, such that the electrical requirements of the semiconductor device 244 are met, thereby increasing performance of the semiconductor device 244. For example, the width w4 of each of the first metal gates 236 may range from about 3 nm to about 300 nm. The width w5 of each of the second metal gates 238 may range from about 3 nm to about 300 nm.

Referring to FIG. 2H and FIG. 2J simultaneously, the first doped portion 208 has an etching selectivity with respect to the other portion 210 of the dummy gate layer 206 during the operation of etching the dummy gate layer 206, such that after the operation of etching the hard mask layer 212 and the dummy gate layer 206 is completed, the width w2 of each of the first dummy gates 224 is different from the width w3 of each of the second dummy gates 226. Thus, after the gate replacement operation is completed, the width w4 of each of the first metal gates 236 replacing the first dummy gates 224 and the width w5 of each of the second metal gates 238 replacing the second dummy gates 226 are different from each other. Therefore, with the application of the double patterning technique of the embodiments of the present application, the semiconductor device 244 including metal gates with different widths can be successfully achieved.

Figure 3:
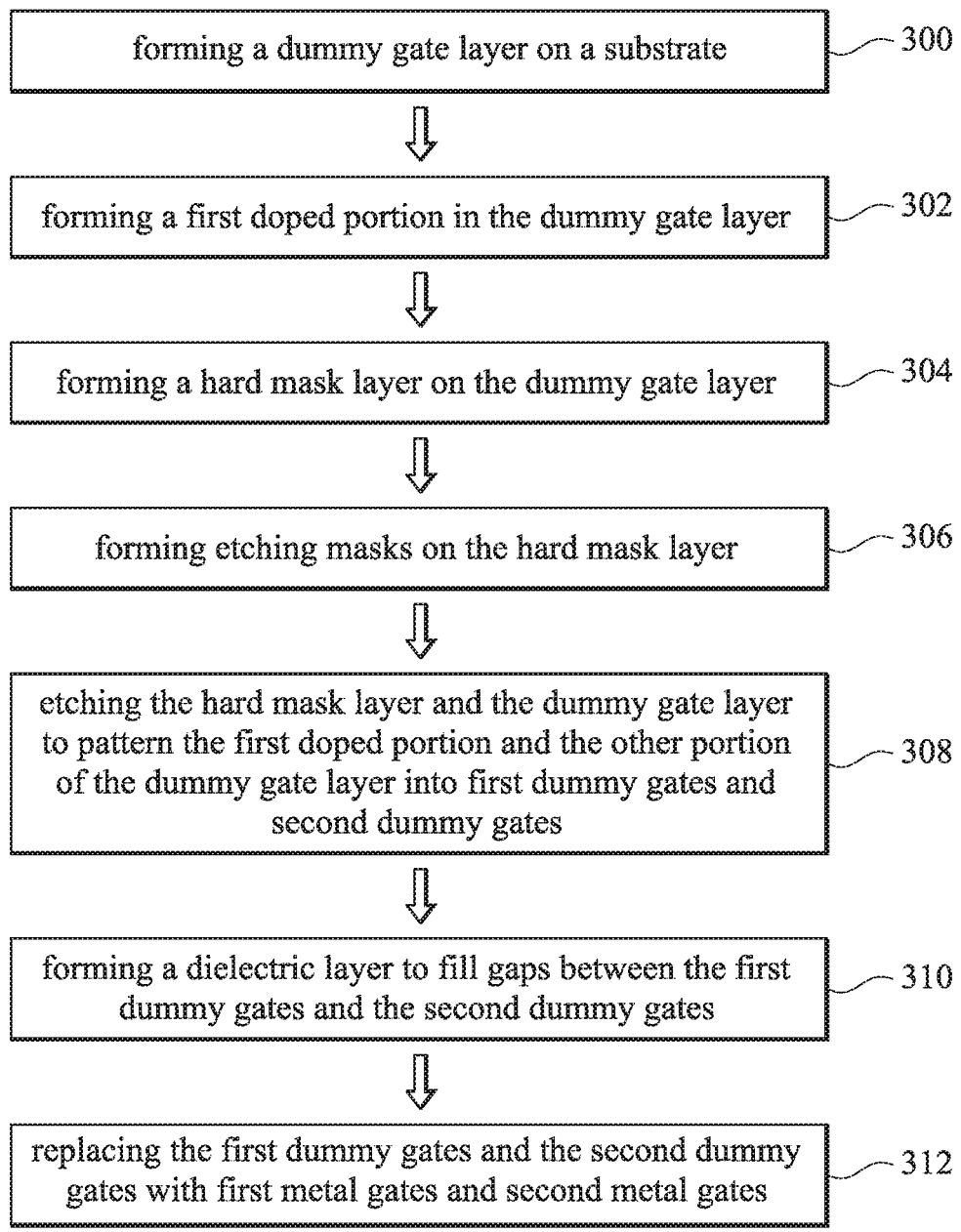
FIG. 3 is a flow chart of a method for manufacturing a semiconductor device in accordance with various embodiments.

Referring to FIG. 3 with FIG. 2A through FIG. 2J, FIG. 3 is a flow chart of a method for manufacturing a semiconductor device in accordance with various embodiments. The method begins at operation 300, where a substrate 200 is provided. In some examples, as shown in FIG. 2A, the substrate 200 may be optionally recessed to form at least one fin structure 202 on a surface 204 of the substrate 200 by using, for example, a photolithography process and an etching process. In the operation of recessing the substrate 200, a portion of the substrate 200 is removed. In such examples, the fin structure 202 is composed of a portion of the substrate 200, such that the fin structure 202 is formed from a material the same as that of the substrate 200. In some examples, silicon, germanium or glass may be used as a material of the substrate 200 and the fin structure 202.

As shown in FIG. 2B, a dummy gate layer 206 is formed on the surface 204 of the substrate 200, in which the dummy gate layer 206 is disposed on a portion of the fin structure 202. In some examples, the dummy gate layer 206 is formed by using a deposition process and an etching process. The deposition process may be a chemical vapor deposition process or a plasma-enhanced chemical vapor deposition process, for example. In some exemplary examples, the dummy gate layer 206 is formed from polysilicon.

At operation 302, as shown in FIG. 2C, a first doped portion 208 is formed in the dummy gate layer 206 by performing, for example, an implant operation on the dummy gate layer 206. For example, the first doped portion 208 may extend from a top of the dummy gate layer 206 to a bottom of the dummy gate layer 206. The implant operation may be performed using at least one dopant, such as boron and phosphorous. Thus, the first doped portion 208 is formed from the material of the dummy gate layer 206 and is doped with the dopant, such that the first doped portion 208 may have an etching selectivity with respect to the dummy gate layer 206 during an operation of etching the dummy gate layer 206. After the implant operation is completed, the dummy gate layer 206 includes the first doped portion 208 and the other portion 210, in which the first doped portion 208 and the portion 210 are arranged in the dummy gate layer 206 side by side, and the portion 210 similarly extends from the top of the dummy gate layer 206 to the bottom of the dummy gate layer 206.

In some examples, the implant operation only forms the first doped portion 208 in the dummy gate layer 206, and the portion 210 of the dummy gate layer 206 is an undoped portion. Thus, the first doped portion 208 is formed to have an etching selectivity with respect to the portion 210 of the dummy gate layer 206 during the operation of etching the dummy gate layer 206.

In some examples, the implant operation includes forming the other portion 210 of the dummy gate layer 206 as a second doped portion. In such examples, the implant operation forms the first doped portion 208 and the portion 210 with different dopants. The portion 210 is formed from the material of the dummy gate layer 206 and is doped with the dopant different from that of the first doped portion 208. Thus, the first doped portion 208 is formed to have an etching selectivity with respect to the portion 210 of the dummy gate layer 206 during an operation of etching the dummy gate layer 206.

At operation 304, as shown in FIG. 2D, a hard mask layer 212 is formed on the dummy gate layer 206 to cover the first doped portion 208 and the portion 210 of the dummy gate layer 206 by using a deposition process, such as a chemical vapor deposition process and a physical vapor deposition process. For example, the hard mask layer 212 may be formed from silicon nitride.

At operation 306, as shown in FIG. 2E through FIG. 2G, various etching masks 214 are respectively formed on portions of the hard mask layer 212. In some examples, an operation of forming the etching masks 214 is performed by using a double patterning process, such as a self-aligned double patterning process and a lithography-etch lithography-etch process. In some exemplary examples, as shown in FIG. 2E, various mandrels 216 are respectively formed on other portions of the hard mask layer 212 by using a deposition or coating process and a photolithography process. The mandrels 216 may substantially have the same width and the same pitch.

Next, as shown in FIG. 2F, a spacer material layer 218 is formed on the hard mask layer 212 and covering the mandrels 216 by using a deposition process, such as a chemical vapor deposition process and a physical vapor deposition process. In some examples, the spacer material layer 218 is formed to conformally cover the hard mask layer 212 and the mandrels 216. For example, a material of the spacer material layer 218 may be different from those of the mandrels 216, the hard mask layer 212 and the dummy gate layer 206.

As shown in FIG. 2G, the mandrels 216 and a portion of the spacer material layer 218 are removed to form the etching masks 214 on the portions of the hard mask layer 212. The etching masks 214 are formed by removing the portion of the spacer material layer 218, such that the etching masks 214 are formed from a material the same as the spacer material layer 218. In some examples, an operation of forming the etching masks 214 includes removing the portion of the spacer material layer 218 to expose a portion of the hard mask layer 212 and tops of the mandrels 216, so as to form various spacers (the spacers are portions of the spacer material layer 218) for the etching masks 214. The spacers are respectively on two opposite side surfaces 220 of each of the mandrels 216 on the hard mask layer 212. Then, the mandrels 216 are removed and the spacers are left to form the etching masks 214, in which each of the etching masks 214 includes one of the spacers, as shown in FIG. 2G. For example, an operation of removing the portion of the spacer material layer 218 may be performed by using an etching back process. In addition, an operation of removing the mandrels 216 may be performed by using an etching process, such as a dry etching process and a wet etching process.

Referring to FIG. 2G again, in some examples, the etching masks 214 are formed to substantially have the same width W. In addition, the etching masks 214 are formed to substantially have the same pitch P. Thus, in such examples, gaps G between any two adjacent ones of the etching masks 214 are substantially the same. Certainly, the widths W of the etching masks 214 may be different, and the pitches P of the two adjacent etching masks 214 may be different.

At operation 308, as shown in FIG. 2G, the hard mask layer 212 and the dummy gate layer 206 are etched with the etching masks 214 on the hard mask layer 212. An operation of etching the hard mask layer 212 and the dummy gate layer 206 is performed to remove a portion of the hard mask layer 212 and a portion of the dummy gate layer 206, so as to respectively pattern the hard mask layer 212, the first doped portion 208 and the portion 210 of the dummy gate layer 206 into various hard masks 222, various first dummy gates 224 and various second dummy gates 226, as shown in FIG. 2H.

In some exemplary examples, the hard mask layer 212 is firstly etched to form the hard masks 222, and the etching masks 214 are removed after the hard masks 222 are formed. Then, the first doped portion 208 and the portion 210 of the dummy gate layer 206 are etched with the hard masks 222 on the dummy gate layer 206. For example, after the operation of etching the hard mask layer 212 is completed, widths of the hard masks 222 may be substantially the same.

The first doped portion 208 has an etching selectivity with respect to the portion 210 of the dummy gate layer 206 during the operation of etching the hard mask layer 212 and the dummy gate layer 206, such that a width w2 of each of the first dummy gates 224 is different from a width w3 of each of the second dummy gates 226. In some examples, an etching rate of the first doped portion 208 is smaller than that of the portion 210 of the dummy gate layer 206, such that after the operation of etching the hard mask layer 212 and the dummy gate layer 206 is completed, the width w2 of each of the first dummy gates 224 is greater than the width w3 of each of the second dummy gates 226. For example, a width w1 of each of the hard masks 222 is substantially equal to the width w3 of each of the second dummy gates 226, and is smaller than the width w2 of each of the first dummy gates 224. Thus, the first dummy gates 224 and the second dummy gates 226 with different widths are achieved.

At operation 310, as shown in FIG. 2I, the hard masks 222 are removed, and a dielectric layer 228 is formed on the substrate 200, the first dummy gates 224 and the second dummy gates 226, and to fill a gap 230 between the first dummy gates 224, a gap 232 between the second dummy gates 226, and a gap 234 between the first dummy gate 224 and the second dummy gate 226 which are adjacent to each other, thereby peripherally enclosing each of the first dummy gates 224 and each of the second dummy gates 226. For example, an operation of forming the dielectric layer 228 may be performed by using a deposition process, such as a chemical vapor deposition process and a physical vapor deposition process. In some exemplary examples, the dielectric layer 228 is formed from silicon oxide, silicon nitride or silicon oxynitride.

At operation 312, as shown in FIG. 2I and FIG. 2J, the first dummy gates 224 and the second dummy gates 226 are replaced with first metal gates 236 and second metal gates 238 respectively to complete a semiconductor device 244. The first metal gates 236 and the second metal gates 238 may be formed from the same metal material, or may be formed from different metal materials. In some examples, an operation of replacing the first dummy gates 224 and the second dummy gates 226 includes performing a polishing process on the dielectric layer 228 to remove a portion of the dielectric layer 228 and expose tops of the first dummy gates 224 and the second dummy gates 226 by using a chemical mechanical polishing technique. Next, the first dummy gates 224 and the second dummy gates 226 are removed to correspondingly form first holes 240 and second holes 242 in the dielectric layer 228 by using a dry etching technique or a wet etching technique. A metal layer (the first metal gates 236 and the second metal gates 238 are portions of the metal layer) is formed to fill the first holes 240 and the second holes 242 and cover the dielectric layer 228 by using a deposition process, such as chemical vapor deposition process and a physical vapor deposition process. Then, the metal layer is polished to remove a portion of the metal layer over the dielectric layer 228 by using a chemical mechanical polishing technique, so as to form the first metal gates 236 and the second metal gates 238 in the first holes 240 and the second holes 242 respectively. In some exemplary examples, a portion the dielectric layer 228 is polished during the operation of polishing the metal layer. The width w2 of each of the first dummy gates 224 is greater than the width w3 of each of the second dummy gates 226, such that each of the first holes 240 is greater than each of the second holes 242.

Referring FIG. 2J again, each of the first holes 240 is greater than each of the second holes 242, such that a width w4 of each of the first metal gates 236 is greater than a width w5 of each of the second metal gates 238. In some examples, a pitch p1 of the first metal gates 236 is substantially the same as a pitch p2 of the second metal gates 238. Certainly, the pitch p1 may be different from the pitch p2. In some exemplary examples, the first metal gates 236 are p-type metal gates, the second metal gates 238 are n-type metal gates, and the width w4 of each of the first metal gates 236 is greater than the width w5 of each of the second metal gates 238.

Figure 4A:
FIG. 4A through FIG. 4J are schematic front views of intermediate stages showing a method for manufacturing a semiconductor device in accordance with various embodiments.

FIG. 4A through FIG. 4J are schematic front views of intermediate stages showing a method for manufacturing a semiconductor device in accordance with various embodiments. As shown in FIG. 4A, a substrate 400 is provided. In some examples, the substrate 400 may be optionally recessed to form at least one fin structure 402 on a surface 404 of the substrate 400 by using, for example, a photolithography process and an etching process. In the operation of recessing the substrate 400, a portion of the substrate 400 is removed. In such examples, the fin structure 402 is composed of a portion of the substrate 400, such that the fin structure 402 is formed from a material the same as that of the substrate 400. The substrate 400 and the fin structure 402 may be composed of a single-crystalline semiconductor material or a compound semiconductor material. In some examples, silicon, germanium or glass may be used as a material of the substrate 400 and the fin structure 402.

Figure 4B:
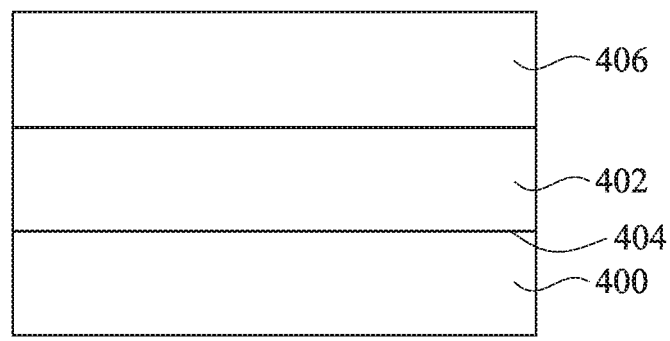

As shown in FIG. 4B, a dummy gate layer 406 is formed on the surface 404 of the substrate 400, in which the dummy gate layer 406 is disposed on a portion of the fin structure 402. In some examples, the dummy gate layer 406 is formed by using a deposition process and an etching process. For example, the deposition process may be a chemical vapor deposition process or a plasma-enhanced chemical vapor deposition process. In some exemplary examples, the dummy gate layer 406 is formed from polysilicon.

Figure 4C:
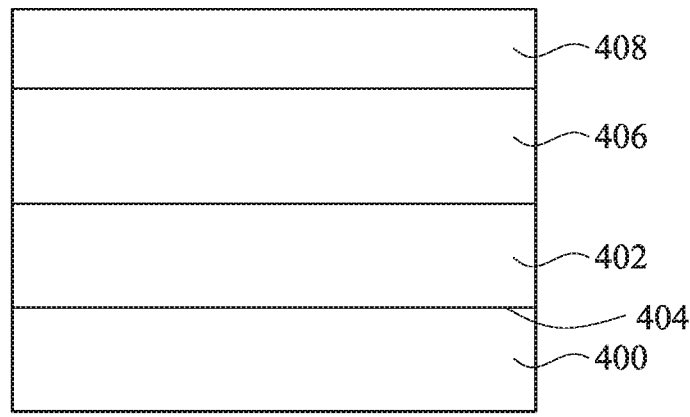

As shown in FIG. 4C, a hard mask layer 408 is formed on the dummy gate layer 406. In some examples, an operation of forming the hard mask layer 408 is performed by using a deposition process, such as a chemical vapor deposition process and a physical vapor deposition process. For example, the hard mask layer 408 may be formed from silicon nitride.

Figure 4D:
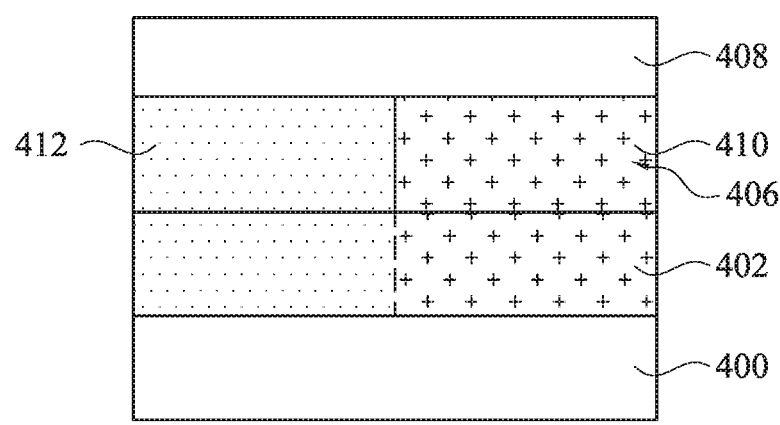

After the operation of forming the hard mask layer 408 is completed, as shown in FIG. 4D, a first doped portion 410 and a second doped portion 412 are formed in the dummy gate layer 406. For example, each of the first doped portion 410 and the second doped portion 412 may extend from a top of the dummy gate layer 406 to a bottom of the dummy gate layer 406. In some examples, an operation of forming the first doped portion 410 and the second doped portion 412 includes performing two implant processes on the dummy gate layer 406. Each of the implant processes is performed using at least one dopant, such as boron and phosphorous, in which the implant processes may be performed using different dopants. Thus, each of the first doped portion 410 and the second doped portion 412 is formed from the material of the dummy gate layer 406 and is doped with one of the dopants, such that the first doped portion 410 may have an etching selectivity with respect to the second doped portion 412 during an operation of etching the dummy gate layer 406. For example, the first doped portion 410 and the second doped portion 412 may be arranged in the dummy gate layer 406 side by side.

Figure 4E:
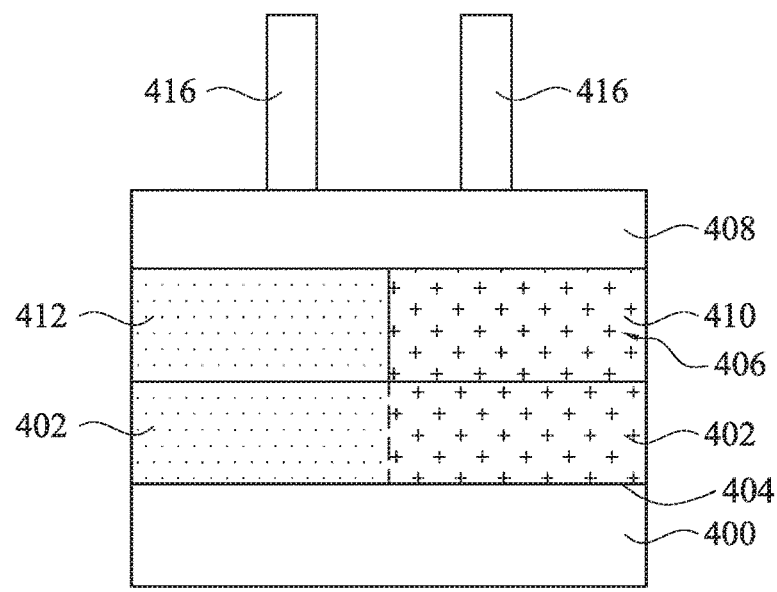
Figure 4F:
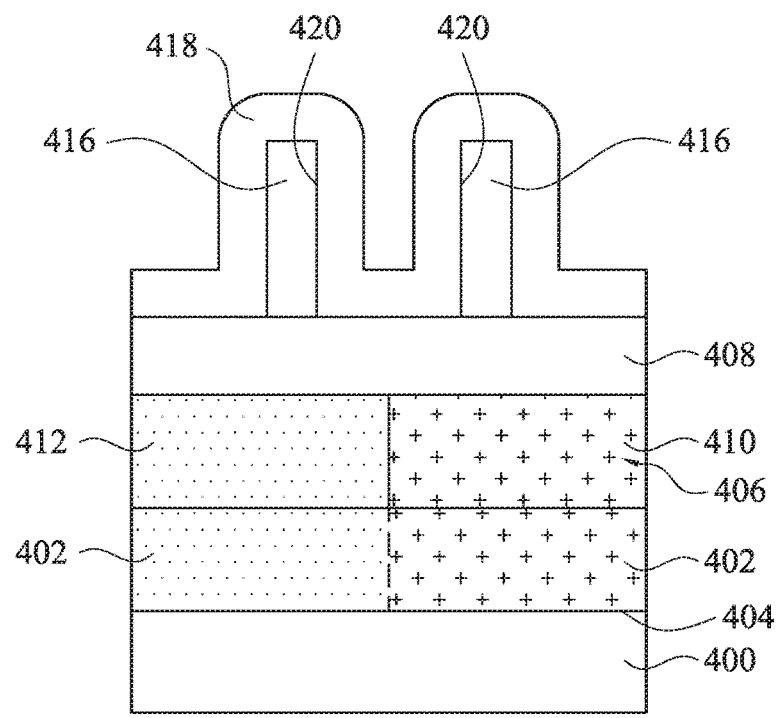
Figure 4G:
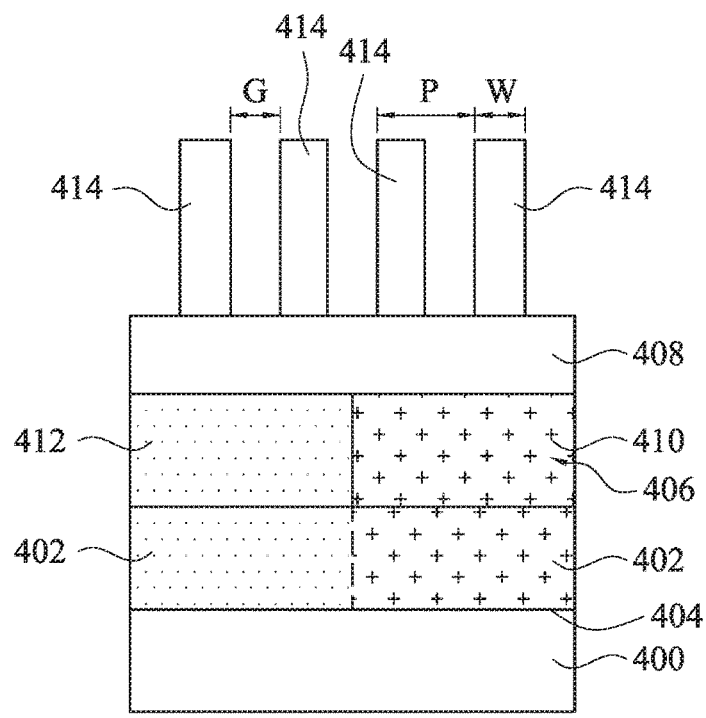

As shown in FIG. 4E through FIG. 4G, various etching masks 414 are respectively formed on portions of the hard mask layer 408. In some examples, an operation of forming the etching masks 414 is performed by using a double patterning process, such as a self-aligned double patterning process and a lithography-etch lithography-etch process. In some exemplary examples, as shown in FIG. 4E, various mandrels 416 are respectively formed on other portions of the hard mask layer 408 by using a deposition or coating process and a photolithography process. The mandrels 416 may substantially have the same width and the same pitch.

Next, as shown in FIG. 4F, a spacer material layer 418 is formed on the hard mask layer 408 and covering the mandrels 416. In some examples, the spacer material layer 418 is formed to conformally cover the hard mask layer 408 and the mandrels 416. For example, an operation of forming the spacer material layer 418 may be performed by using a deposition process, such as a chemical vapor deposition process and a physical vapor deposition process. A material of the spacer material layer 418 is different from those of the mandrels 416, the hard mask layer 408 and the dummy gate layer 406.

As shown in FIG. 4G, the mandrels 416 and a portion of the spacer material layer 418 are removed to form the etching masks 414 on the portions of the hard mask layer 408. The etching masks 414 are formed by removing the portion of the spacer material layer 418, such that the etching masks 414 are formed from a material the same as the spacer material layer 418. In some examples, an operation of forming the etching masks 414 includes removing the portion of the spacer material layer 418 to expose a portion of the hard mask layer 408 and tops of the mandrels 416, so as to form various spacers (the spacers are portions of the spacer material layer 418) for the etching masks 414. The spacers are respectively formed on two opposite side surfaces 420 of each of the mandrels 416 on the hard mask layer 408. For example, the spacers may be formed to have substantially the same width. Then, the mandrels 416 are removed and the spacers are left to form the etching masks 414, in which each of the etching masks 414 includes one of the spacers, as shown in FIG. 4G. For example, an operation of removing the portion of the spacer material layer 418 may be performed by using an etching back process. In addition, an operation of removing the mandrels 416 may be performed by using an etching process, such as a dry etching process and a wet etching process.

Referring to FIG. 4G again, in some examples, the operation of forming the etching masks 414 includes forming each of the etching masks 414 having a width W which is substantially equal to one another. In addition, the etching masks 414 are formed to substantially have the same pitch P. Thus, in such examples, gaps G between two adjacent ones of the etching masks 414 are substantially the same. Certainly, the widths W of the etching masks 414 may be different, and the pitches P of the two adjacent etching masks 414 may be different.

Figure 4H:
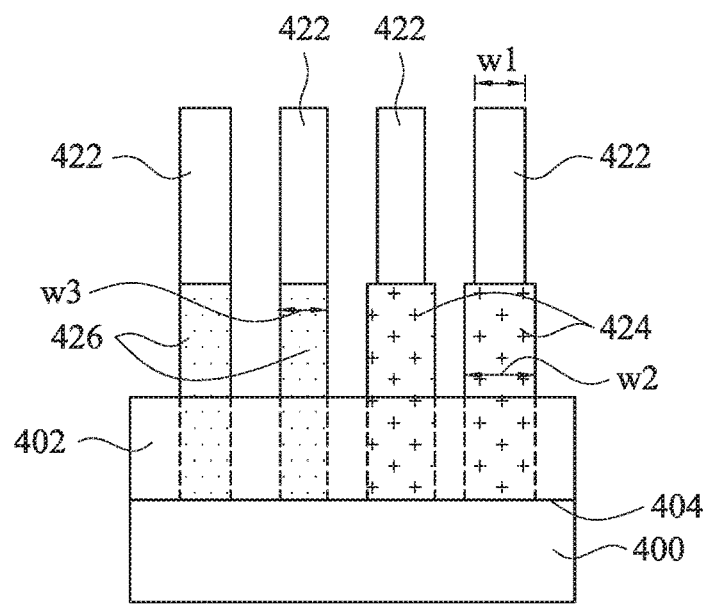

As shown in FIG. 4G, the hard mask layer 408 and the dummy gate layer 406 are etched by an etching process with the etching masks 414 on the hard mask layer 408. An operation of etching the hard mask layer 408 and the dummy gate layer 406 is performed to remove a portion of the hard mask layer 408 and a portion of the dummy gate layer 406, so as to respectively pattern the hard mask layer 408, the first doped portion 410 and the second doped portion 412 into various hard masks 422, various first dummy gates 424 and various second dummy gates 426, as shown in FIG. 4H. For example, the second dummy gates 426 may be adjacent to the first dummy gates 424. In some exemplary examples, the hard mask layer 408 is firstly etched to form the hard masks 422, and the etching masks 414 are removed after the hard masks 422 are formed, and then the first doped portion 410 and the second doped portion 412 of the dummy gate layer 206 are etched with the hard masks 422 on the dummy gate layer 406. For example, after the operation of etching the hard mask layer 408 is completed, widths of the hard masks 422 may be substantially the same.

Because the first doped portion 410 has an etching selectivity with respect to the second doped portion 412, an etching amount of the first doped portion 410 is different from that of the second doped portion 412 during the operation of etching the hard mask layer 408 and the dummy gate layer 406, and a width w2 of each of the first dummy gates 424 is different from a width w3 of each of the second dummy gates 426. In some examples, an etching rate of the first doped portion 410 is smaller than that of the second doped portion 412, such that after the operation of etching the hard mask layer 408 and the dummy gate layer 406 is completed, the width w2 of each of the first dummy gates 424 is greater than the width w3 of each of the second dummy gates 426. For example, a width w1 of each of the hard masks 422 is substantially equal to the width w3 of each of the second dummy gates 426, and is smaller than the width w2 of each of the first dummy gates 424. Therefore, the first dummy gates 424 and the second dummy gates 426 with different widths are achieved.

Figure 4I:
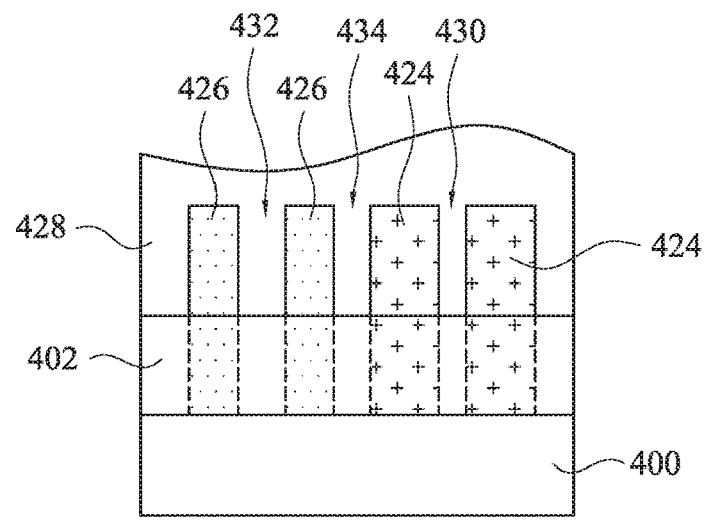

As shown in FIG. 4I, the hard masks 422 are removed, and a dielectric layer 428 is formed on the substrate 400, the first dummy gates 424 and the second dummy gates 426, and to fill a gap 430 between the first dummy gates 424, a gap 432 between the second dummy gates 426, and a gap 434 between the first dummy gate 424 and the second dummy gate 426 which are adjacent to each other, thereby peripherally enclosing each of the first dummy gates 424 and each of the second dummy gates 426. For example, an operation of forming the dielectric layer 428 may be performed by using a deposition process, such as a chemical vapor deposition process and a physical vapor deposition process. In some exemplary examples, the dielectric layer 428 is formed from silicon oxide, silicon nitride or silicon oxynitride.

Figure 4J:
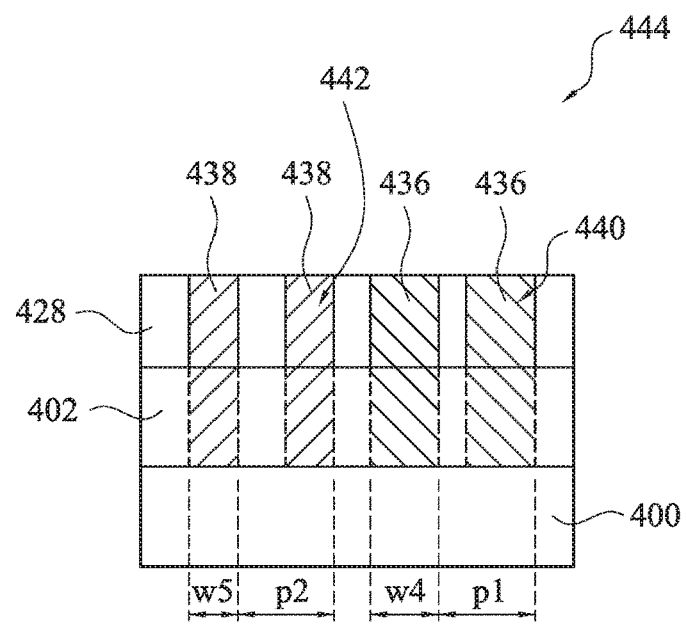

Then, as shown in FIG. 4I and FIG. 4J, the first dummy gates 424 and the second dummy gates 426 are replaced with first metal gates 436 and second metal gates 438 respectively to complete a semiconductor device 444. The first metal gates 436 and the second metal gates 438 may be formed from the same metal material, or may be formed from different metal materials. In some examples, an operation of replacing the first dummy gates 424 and the second dummy gates 426 includes performing a polishing process on the dielectric layer 428 to remove a portion of the dielectric layer 428 and expose tops of the first dummy gates 424 and the second dummy gates 426. Next, the first dummy gates 424 and the second dummy gates 426 are removed to correspondingly form first holes 440 and second holes 442 in the dielectric layer 428. A metal layer (the first metal gates 436 and the second metal gates 438 are portions of the metal layer) is formed to fill the first holes 440 and the second holes 442 and cover the dielectric layer 428. Then, the metal layer is polished to remove a portion of the metal layer over the dielectric layer 428, so as to form the first metal gates 436 and the second metal gates 438 in the first holes 440 and the second holes 442 respectively. Thus, the first metal gates 436 and the second metal gates 438 are peripherally enclosed by the dielectric layer 428.

In some exemplary examples, the polishing process of the dielectric layer 428 is performed by using a chemical mechanical polishing technique. An operation of removing the first dummy gates 424 and the second dummy gates 426 may be performed using a dry etching technique or a wet etching technique. The width w2 of each of the first dummy gates 424 is greater than the width w3 of each of the second dummy gates 426, such that each of the first holes 440 is greater than each of the second holes 442. For example, an operation of forming the metal layer may be performed by using a deposition process, such as chemical vapor deposition process and a physical vapor deposition process. An operation of polishing the metal layer may be performed by using a chemical mechanical polishing process. In some exemplary examples, a portion of the dielectric layer 428 is polished during the operation of polishing the metal layer.

Referring FIG. 4J again, each of the first holes 440 is greater than each of the second holes 442, such that a width w4 of each of the first metal gates 436 is greater than a width w5 of each of the second metal gates 438. In some examples, a pitch p1 of the first metal gates 436 is substantially the same as a pitch p2 of the second metal gates 438. Certainly, the pitch p1 may be different from the pitch p2. In some exemplary examples, the first metal gates 436 are p-type metal gates, the second metal gates 438 are n-type metal gates, and the width w4 of each of the first metal gates 436 is greater than the width w5 of each of the second metal gates 438. In such examples, the width w4 of each of the first metal gates 436 of p-type is greater than the width w5 of each of the second metal gates 438 of n-type, such that the electrical requirements of the semiconductor device 444 are met, thereby increasing performance of the semiconductor device 444. For example, the width w4 of each of the first metal gates 436 may range from about 3 nm to about 300 nm. The width w5 of each of the second metal gates 438 may range from about 3 nm to about 300 nm.

Referring to FIG. 4H and FIG. 4J simultaneously, the first doped portion 410 has an etching selectivity with respect to the second doped portion 412 during the operation of etching the dummy gate layer 406, such that after the operation of etching the hard mask layer 408 and the dummy gate layer 406 is completed, the width w2 of each of the first dummy gates 424 is different from the width w3 of each of the second dummy gates 426. Thus, after the gate replacement operation is completed, the width w4 of each of the first metal gates 436 replacing the first dummy gates 424 and the width w5 of each of the second metal gates 438 replacing the second dummy gates 426 are different from each other. Therefore, with the application of the double patterning technique of the embodiments of the present application, the semiconductor device 444 including metal gates with different widths can be successfully achieved.

Figure 5:
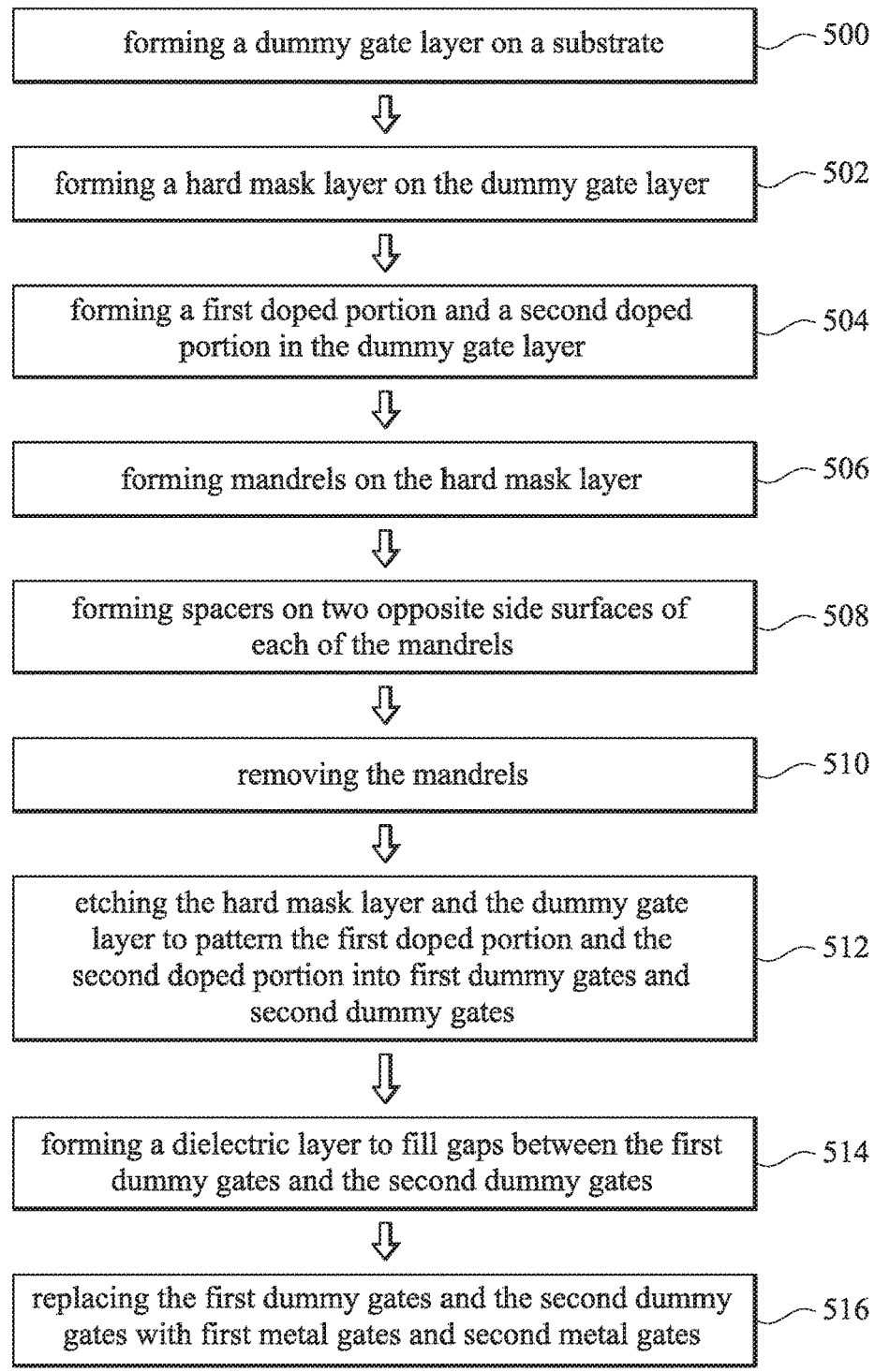
FIG. 5 is a flow chart of a method for manufacturing a semiconductor device in accordance with various embodiments.

Referring to FIG. 5 with FIG. 4A through FIG. 4J, FIG. 5 is a flow chart of a method for manufacturing a semiconductor device in accordance with various embodiments. The method begins at operation 500, where a substrate 400 is provided. In some examples, as shown in FIG. 4A, the substrate 400 may be optionally recessed to form at least one fin structure 402 on a surface 404 of the substrate 400 by using, for example, a photolithography process and an etching process. In the operation of recessing the substrate 400, a portion of the substrate 400 is removed. In such examples, the fin structure 402 is composed of a portion of the substrate 400, such that the fin structure 402 is formed from a material the same as that of the substrate 400. In some examples, silicon, germanium or glass may be used as a material of the substrate 400 and the fin structure 402.

As shown in FIG. 4B, a dummy gate layer 406 is formed on the surface 404 of the substrate 400, in which the dummy gate layer 406 is disposed on a portion of the fin structure 402. In some examples, the dummy gate layer 406 is formed by using a deposition process and an etching process. The deposition process may be a chemical vapor deposition process or a plasma-enhanced chemical vapor deposition process, for example. In some exemplary examples, the dummy gate layer 406 is formed from polysilicon.

At operation 502, as shown in FIG. 4C, a hard mask layer 408 is formed on the dummy gate layer 406 by using a deposition process, such as a chemical vapor deposition process and a physical vapor deposition process. For example, the hard mask layer 408 may be formed from silicon nitride.

At operation 504, as shown in FIG. 4D, a first doped portion 410 and a second doped portion 412 are formed in the dummy gate layer 406 through the hard mask layer 408. For example, each of the first doped portion 410 and the second doped portion 412 may extend from a top of the dummy gate layer 406 to a bottom of the dummy gate layer 406. In some examples, an operation of forming the first doped portion 410 and the second doped portion 412 includes performing two implant processes on the dummy gate layer 406. Each of the implant processes is performed using at least one dopant, such as boron and phosphorous, in which the implant processes may be performed using different dopants. Thus, each of the first doped portion 410 and the second doped portion 412 is formed from the material of the dummy gate layer 406 and is doped with one of the dopants, such that the first doped portion 410 may have an etching selectivity with respect to the second doped portion 412 during an operation of etching the dummy gate layer 406. For example, the first doped portion 410 and the second doped portion 412 may be arranged in the dummy gate layer 406 side by side.

Referring to FIG. 4G firstly, various etching masks 414 are respectively formed on portions of the hard mask layer 408. In some examples, an operation of forming the etching masks 414 is performed by using a double patterning process, such as a self-aligned double patterning process and a lithography-etch lithography-etch process. In some exemplary examples, at operation 506, as shown in FIG. 4E, various mandrels 416 are respectively formed on other portions of the hard mask layer 408 by using a deposition or coating process and a photolithography process. The mandrels 416 may substantially have the same width and the same pitch.

At operation 508, as shown in FIG. 4F, a spacer material layer 418 is formed on the hard mask layer 408 and covering the mandrels 416 by using a deposition process, such as a chemical vapor deposition process and a physical vapor deposition process. In some examples, the spacer material layer 418 is formed to conformally cover the hard mask layer 408 and the mandrels 416. A material of the spacer material layer 418 is different from those of the mandrels 416, the hard mask layer 408 and the dummy gate layer 406. Then, a portion of the spacer material layer 418 is removed to expose a portion of the hard mask layer 408 and tops of the mandrels 416, so as to form various spacers (the spacers are portions of the spacer material layer 418) for the etching masks 414. For example, an operation of removing the portion of the spacer material layer 418 may be performed by using an etching back process. The spacers are respectively formed on two opposite side surfaces 420 of each of the mandrels 416 on the hard mask layer 408. For example, the spacers may be formed to have substantially the same width.

At operation 510, as shown in FIG. 4G, the mandrels 416 are removed, and the spacers are left to form the etching masks 414 on the portions of the hard mask layer 408, in which each of the etching masks 414 includes one of the spacers. Thus, the etching masks 414 are formed from a material the same as the spacer material layer 418. For example, an operation of removing the mandrels 416 may be performed by using an etching process, such as a dry etching process and a wet etching process.

Referring to FIG. 4G again, in some examples, the etching masks 414 are formed to substantially have the same width W. In addition, the etching masks 414 are formed to substantially have the same pitch P. Thus, in such examples, gaps G between two adjacent ones of the etching masks 414 are substantially the same. Certainly, the widths W of the etching masks 414 may be different, and the pitches P of the two adjacent etching masks 414 may be different.

At operation 512, as shown in FIG. 4G, the hard mask layer 408 and the dummy gate layer 406 are etched with the etching masks 414 on the hard mask layer 408. An operation of etching the hard mask layer 408 and the dummy gate layer 406 is performed to remove a portion of the hard mask layer 408 and a portion of the dummy gate layer 406, so as to respectively pattern the hard mask layer 408, the first doped portion 410 and the second doped portion 412 into various hard masks 422, various first dummy gates 424 and various second dummy gates 426, as shown in FIG. 4H. In some exemplary examples, the hard mask layer 408 is firstly etched to form the hard masks 422, and the etching masks 414 are removed after the hard masks 422 are formed, and then the first doped portion 410 and the second doped portion 412 of the dummy gate layer 206 are etched with the hard masks 422 on the dummy gate layer 406. For example, after the operation of etching the hard mask layer 408 is completed, widths of the hard masks 422 may be substantially the same.

The first doped portion 410 has an etching selectivity with respect to the second doped portion 412 during the operation of etching the hard mask layer 408 and the dummy gate layer 406, such that a width w2 of each of the first dummy gates 424 is different from a width w3 of each of the second dummy gates 426. In some examples, an etching rate of the first doped portion 410 is smaller than that of the second doped portion 412, such that after the operation of etching the hard mask layer 408 and the dummy gate layer 406 is completed, the width w2 of each of the first dummy gates 424 is greater than the width w3 of each of the second dummy gates 426. For example, a width w1 of each of the hard masks 422 is substantially equal to the width w3 of each of the second dummy gates 426, and is smaller than the width w2 of each of the first dummy gates 424. Thus, the first dummy gates 424 and the second dummy gates 426 with different widths are achieved.

At operation 514, as shown in FIG. 4I, the hard masks 422 are removed, and a dielectric layer 428 is formed on the substrate 400, the first dummy gates 424 and the second dummy gates 426, and to fill a gap 430 between the first dummy gates 424, s gap 432 between the second dummy gates 426, and a gap 434 between the first dummy gate 424 and the second dummy gate 426 which are adjacent to each other, thereby peripherally enclosing each of the first dummy gates 424 and each of the second dummy gates 426. For example, an operation of forming the dielectric layer 428 may be performed by using a deposition process, such as a chemical vapor deposition process and a physical vapor deposition process. In some exemplary examples, the dielectric layer 428 is formed from silicon oxide, silicon nitride or silicon oxynitride.

At operation 516, as shown in FIG. 4I and FIG. 4J, the first dummy gates 424 and the second dummy gates 426 are replaced with first metal gates 436 and second metal gates 438 respectively to complete a semiconductor device 444. In some examples, an operation of replacing the first dummy gates 424 and the second dummy gates 426 includes performing a polishing process on the dielectric layer 428 to remove a portion of the dielectric layer 428 and expose tops of the first dummy gates 424 and the second dummy gates 426 by using a chemical mechanical polishing technique. Next, the first dummy gates 424 and the second dummy gates 426 are removed to correspondingly form first holes 440 and second holes 442 in the dielectric layer 428 by using a dry etching technique or a wet etching technique. A metal layer (the first metal gates 436 and the second metal gates 438 are portions of the metal layer) is formed to fill the first holes 440 and the second holes 442 and cover the dielectric layer 428 by using a deposition process, such as chemical vapor deposition process and a physical vapor deposition process. Then, the metal layer is polished to remove a portion of the metal layer over the dielectric layer 428 by using a chemical mechanical polishing technique, so as to form the first metal gates 436 and the second metal gates 438 in the first holes 440 and the second holes 442 respectively. In some exemplary examples, a portion of the dielectric layer 428 is polished during the operation of polishing the metal layer. The width w2 of each of the first dummy gates 424 is greater than the width w3 of each of the second dummy gates 426, such that each of the first holes 440 is greater than each of the second holes 442.

Referring FIG. 4J again, each of the first holes 440 is greater than each of the second holes 442, such that a width w4 of each of the first metal gates 436 is greater than a width w5 of each of the second metal gates 438. In some examples, a pitch p1 of the first metal gates 436 is substantially the same as a pitch p2 of the second metal gates 438. Certainly, the pitch p1 may be different from the pitch p2. In some exemplary examples, the first metal gates 436 are p-type metal gates, the second metal gates 438 are n-type metal gates, and the width w4 of each of the first metal gates 436 is greater than the width w5 of each of the second metal gates 438.

In accordance with an embodiment, the present disclosure discloses a method for manufacturing a semiconductor device. In this method, a dummy gate layer is formed on a substrate. A hard mask layer is formed on the dummy gate layer. A first doped portion is formed in the dummy gate layer, in which the first doped portion is formed to have an etching selectivity with respect to the other portion of the dummy gate layer. Various etching masks are respectively formed on portions of the hard mask layer. The hard mask layer and the dummy gate layer are etched to respectively pattern the first doped portion and the other portion of the dummy gate layer into various first dummy gates and various second dummy gates, in which a width of each of the first dummy gates is different from a width of each of the second dummy gates. A dielectric layer is formed to peripherally enclose each of the first dummy gates and each of the second dummy gates. The first dummy gates and the second dummy gates are replaced with various first metal gates and various second metal gates respectively.

In accordance with another embodiment, the present disclosure discloses a method for manufacturing a semiconductor device. In this method, a dummy gate layer is formed on a substrate. A hard mask layer is formed on the dummy gate layer. A first doped portion and a second doped portion are formed in the dummy gate layer, in which the first doped portion is formed to have an etching selectivity with respect to the second doped portion. Various mandrels are formed on portions of the hard mask layer. Various spacers are respectively formed on two opposite side surfaces of each of the mandrels on the hard mask layer. The mandrels are removed. The hard mask layer and the dummy gate layer are etched to respectively pattern the first doped portion and the second doped portion into various first dummy gates and various second dummy gates, in which a width of each of the first dummy gates is different from a width of each of the second dummy gates. A dielectric layer is formed to peripherally enclose each of the first dummy gates and each of the second dummy gates. The first dummy gates and the second dummy gates are replaced with various first metal gates and various second metal gates respectively.

In accordance with yet another embodiment, the present disclosure discloses a semiconductor device. The semiconductor device includes a substrate, various first metal gates, various second metal gates and a dielectric layer. The first metal gates are disposed on the substrate. The second metal gates are disposed on the substrate, in which a width of each of the first metal gates is different from a width of each of the second metal gates, and a pitch of the first metal gates is substantially the same as a pitch of the second metal gates. The dielectric layer peripherally encloses the first metal gates and the second metal gates over the substrate.

One general aspect of embodiments disclosed herein includes a semiconductor device, including: a substrate. The semiconductor device also includes a plurality of first metal gates on the substrate. The semiconductor device also includes a plurality of second metal gates on the substrate, where a width of each of the first metal gates is different from a width of each of the second metal gates, and a pitch of the first metal gates is substantially the same as a pitch of the second metal gates. The semiconductor device also includes a dielectric layer peripherally enclosing the first metal gates and the second metal gates over the substrate.

Another general aspect of embodiments disclosed herein includes a semiconductor device including: a substrate; a fin structure extending from the substrate; two first metal gates extending over the fin structure, each of the respective first metal gates having a first width, the first metal gates being separated by a first pitch; and two second metal gates extending over the fin structure, each of the respective second metal gates having a second width less than the first width, the second metal gates being separated by the fins.

Yet another general aspect of embodiments disclosed herein includes an integrated circuit including: a substrate; a first n-type FET and a second n-type FET on the substrate, the first n-type FET and the second n-type FET being spaced apart by a first pitch and having respective metal gate electrodes with a first width; a first p-type FET and a second p-type FET on the substrate, the first p-type FET and the second p-type FET being spaced apart by the first pitch and having respective metal gate electrodes with a second width greater than the first width; and a dielectric structure covering respective sidewalls of the first n-type FET, the second n-type FET, the first p-type FET and the second p-type FET.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
    a substrate;
    a fin structure extending from the substrate;
    two first metal gates extending over the fin structure, each of the respective first metal gates having a first width, the first metal gates being separated by a first pitch; and
    two second metal gates extending over the fin structure, each of the respective second metal gates having a second width less than the first width, the second metal gates being separated by the first pitch.

2. The semiconductor device of claim 1, wherein the two first metal gates are p-type metal gates and each of the two second metal gates are n-type metal gates.

3. The semiconductor device of claim 1, wherein the two first metal gates and the two second metal gates comprise a same material.

4. The semiconductor device of claim 1, wherein the first two metal gates and the two second metal gates are the same material.

5. The semiconductor device of claim 1, wherein a region between the two first metal gates is filled with a dielectric layer and the region between one of the first two metal gates and one of the two second metal gates is filled with the dielectric layer.

6. The semiconductor device of claim 1, further comprising a dielectric layer peripherally enclosing the two first metal gates and the two second metal gates.

7. The semiconductor device of claim 1, wherein the two first metal gates are adjacent the two second metal gates and a region between the two first metal gates and the two second metal gates is filled with a dielectric layer.

8. An integrated circuit comprising:
    a substrate;
    a first n-type FET and a second n-type FET formed on a first fin extending from the substrate, the first n-type FET and the second n-type FET being spaced apart by a first pitch and having respective metal gate electrodes with a first width;
    a first p-type FET and a second p-type FET formed on a second fin extending from the substrate, the first p-type FET and the second p-type FET being spaced apart by the first pitch and having respective metal gate electrodes with a second width greater than the first width; and
    a dielectric structure covering respective sidewalls of the first n-type FET, the second n-type FET, the first p-type FET and the second p-type FET.

9. The integrated circuit of claim 8, further comprising a fin structure in which the n-type FETs and the p-type FETS are formed.

10. The integrated circuit of claim 8, wherein the dielectric structure fills spaces between the respective FETs.

11. The integrated circuit of claim 8, wherein the first width is in a range of from about 3 nm to about 300 nm and the second width is in the range of from about 3 nm to about 300 nm.

12. The integrated circuit of claim 8, wherein the dielectric structure comprises a material selected from the group consisting of silicon oxide, silicon nitride and silicon oxynitride.

13. A semiconductor device, comprising:
    a substrate;
    a plurality fins extending from the substrate;
    a plurality of metal gates extending over respective ones of the plurality of fins;
    the plurality of metal gates including
        a grouping of first metal gates having respective first widths and separated by a first pitch; and
        a second grouping of metal gates having respective second widths, different from the respective first widths, and being separated by a second pitch that is substantially the same as the first pitch; and
    a dielectric layer peripherally enclosing the first grouping of metal gates and the second grouping of metal gates.

14. The semiconductor device of claim 13, wherein the width of each of the second grouping of metal gates is greater than the width of each of the first grouping of metal gates.

15. The semiconductor device of claim 13, further comprising a fin structure extending from the substrate, wherein the first grouping of metal gates and the second grouping of metal gates extend over the fin structure.

16. The semiconductor device of claim 13, wherein the plurality of fins comprises the same material as the substrate.

17. The semiconductor device of claim 13, wherein the plurality of fins comprises a compound semiconductor material.

18. The semiconductor device of claim 17, wherein the substrate comprises silicon.

19. The semiconductor device of claim 13, wherein the dielectric layer is a material selected from the group consisting of silicon oxide, silicon nitride and silicon oxynitride.

20. The semiconductor device of claim 13, wherein the width of each of the first metal gates is from about 3 nm to about 300 nm.

* * * * *